(12) United States Patent
Wada et al.

(10) Patent No.: US 7,522,021 B2
(45) Date of Patent: Apr. 21, 2009

(54) SURFACE ACOUSTIC WAVE APPARATUS

(75) Inventors: Koichi Wada, Yokohama (JP); Seiichi Mitobe, Yokohama (JP); Shogo Inoue, Kawasaki (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 360 days.

(21) Appl. No.: 11/349,108

(22) Filed: Feb. 8, 2006

(65) Prior Publication Data

US 2007/0008052 A1 Jan. 11, 2007

(30) Foreign Application Priority Data

Jul. 6, 2005 (JP) ............... 2005-197364

(51) Int. Cl.
*H03H 9/145* (2006.01)
*H03H 9/25* (2006.01)
*H03H 9/64* (2006.01)

(52) U.S. Cl. .................... 333/196; 310/313 C
(58) Field of Classification Search ................ 333/196; 310/313 C
See application file for complete search history.

(56) References Cited

U.S. PATENT DOCUMENTS 4,684,907 A * 8/1987 Zibis ................ 333/196

2004/0247153 A1 12/2004 Ruile et al.
2006/0158061 A1 7/2006 Hauser et al.

FOREIGN PATENT DOCUMENTS

| DE | 101 35 871 A1 | 2/2003 |
| DE | 103 09 250 A1 | 9/2004 |
| JP | 7-22898 | 1/1995 |
| JP | 7-28195 | 3/1995 |
| JP | 9-270667 | 10/1997 |

* cited by examiner

*Primary Examiner*—Barbara Summons
(74) *Attorney, Agent, or Firm*—Arent Fox LLP

(57) ABSTRACT

A surface acoustic wave apparatus has a configuration by which the spurious of the higher-order transverse modes is suppressed and a SAW excitation intensity distribution is not changed in the propagation direction. The surface acoustic wave apparatus has at least one interdigital transducer, which is disposed such that a plurality of comb-shape electrodes respectively connected to common electrodes are interleaved, wherein a region with the plurality of interleaved comb-shape electrodes has a first overlapping region with a overlapping length constant over a whole area along a propagation direction of a surface acoustic wave and a second overlapping region formed on at least one side of the first overlapping region with a overlapping length weighted in the propagation direction of the surface acoustic wave, and wherein an overlapping-length weighting envelope curve in the second overlapping region has at least two changing points in the propagation direction of the surface acoustic wave.

15 Claims, 11 Drawing Sheets

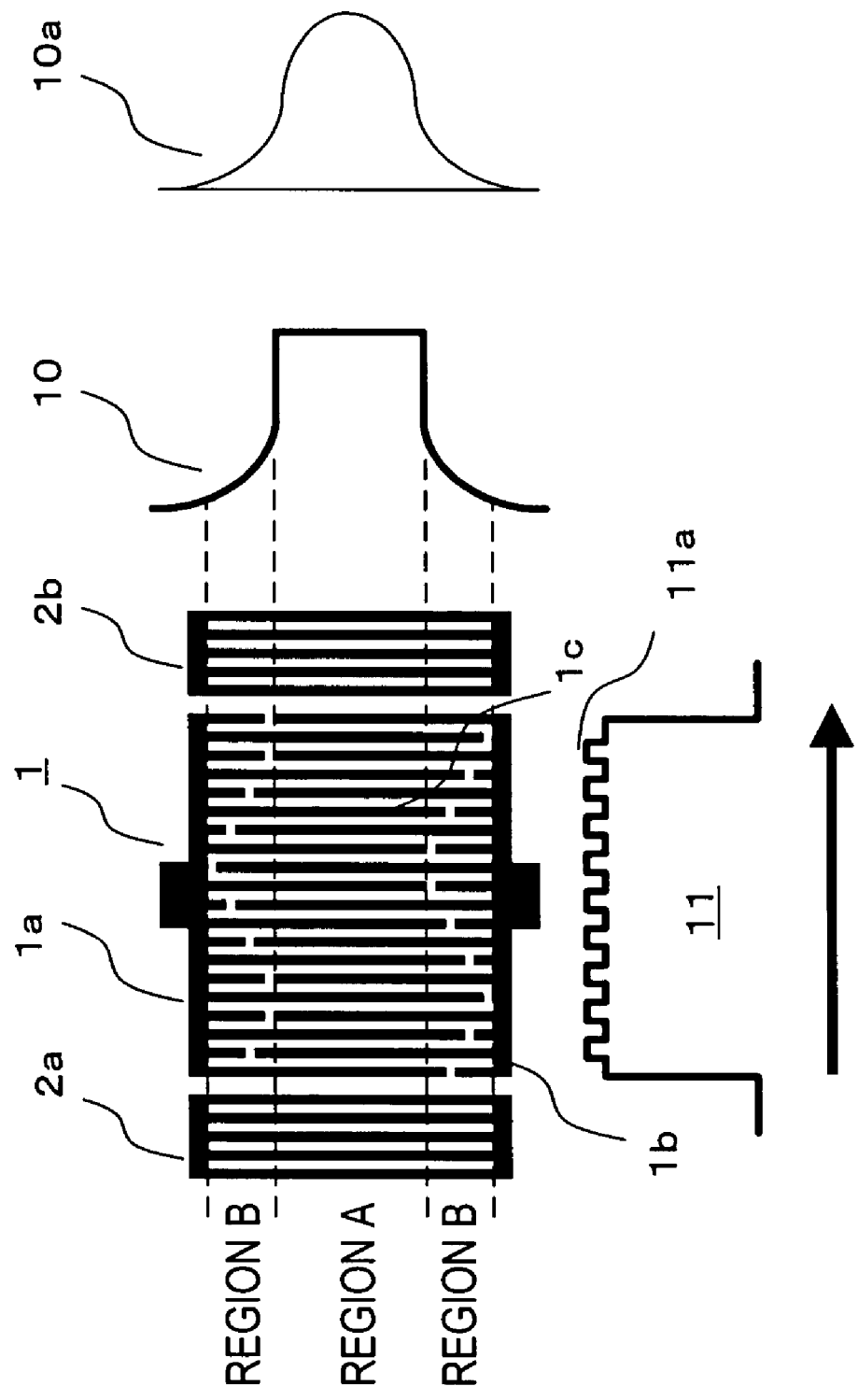

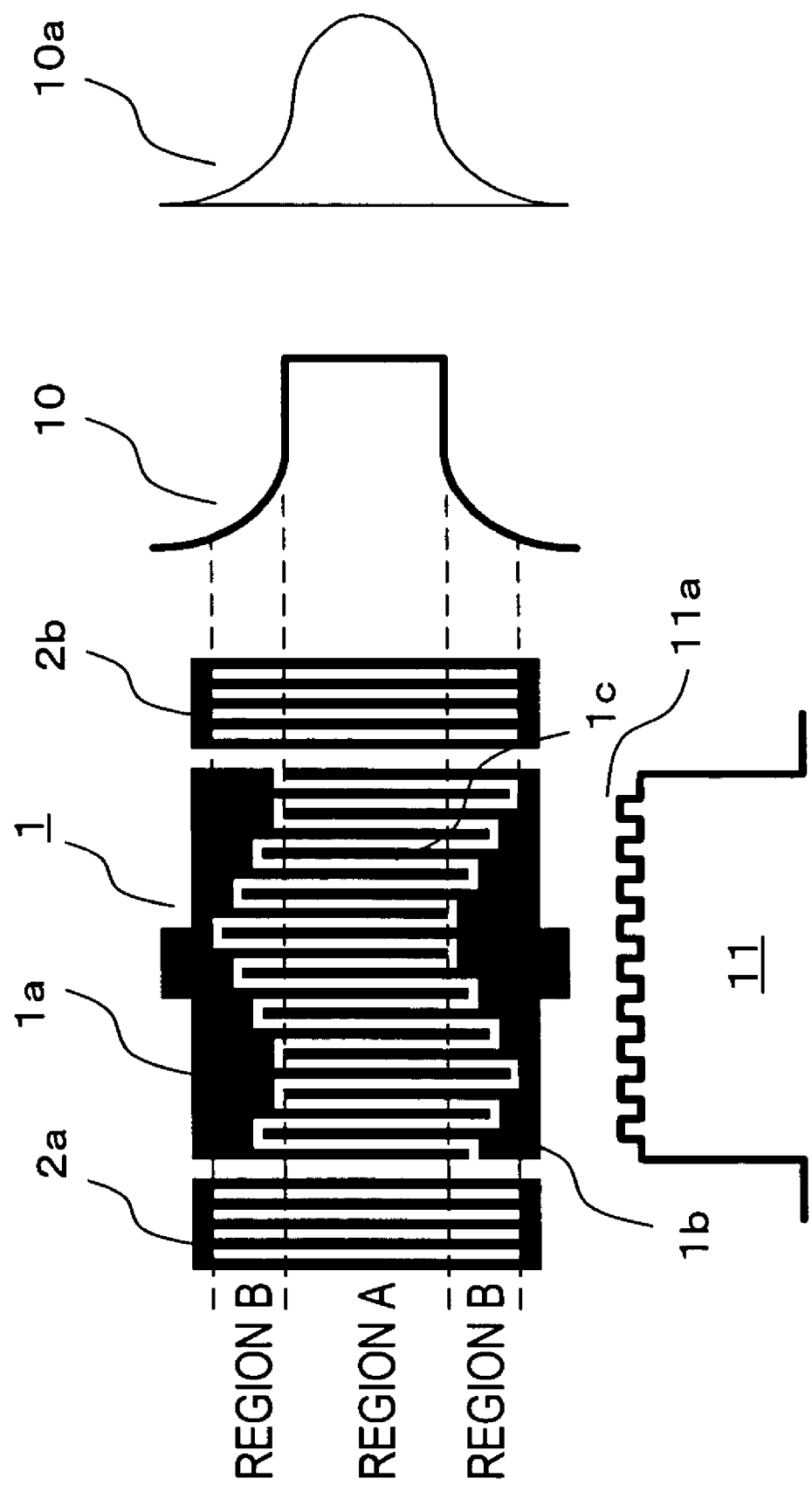

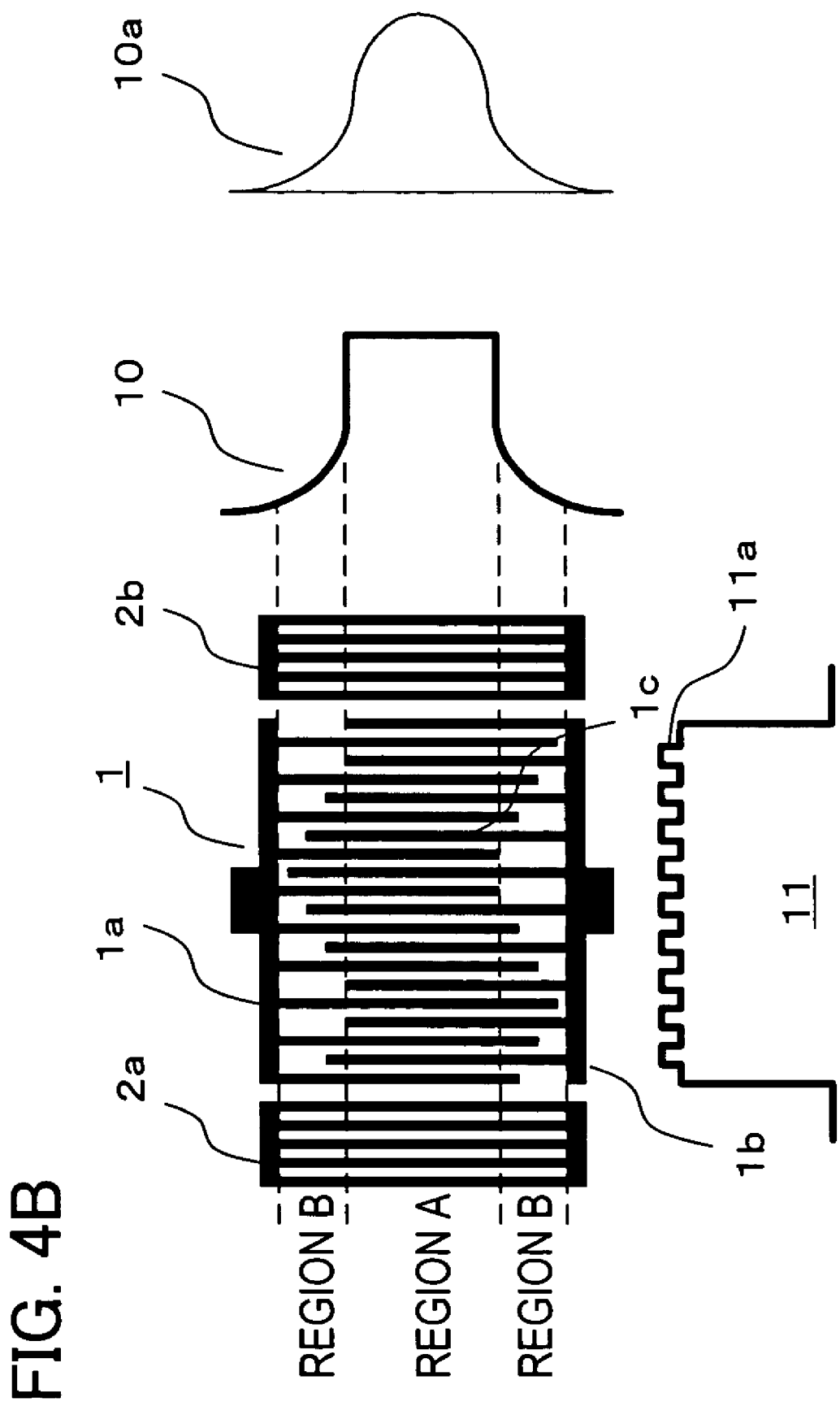

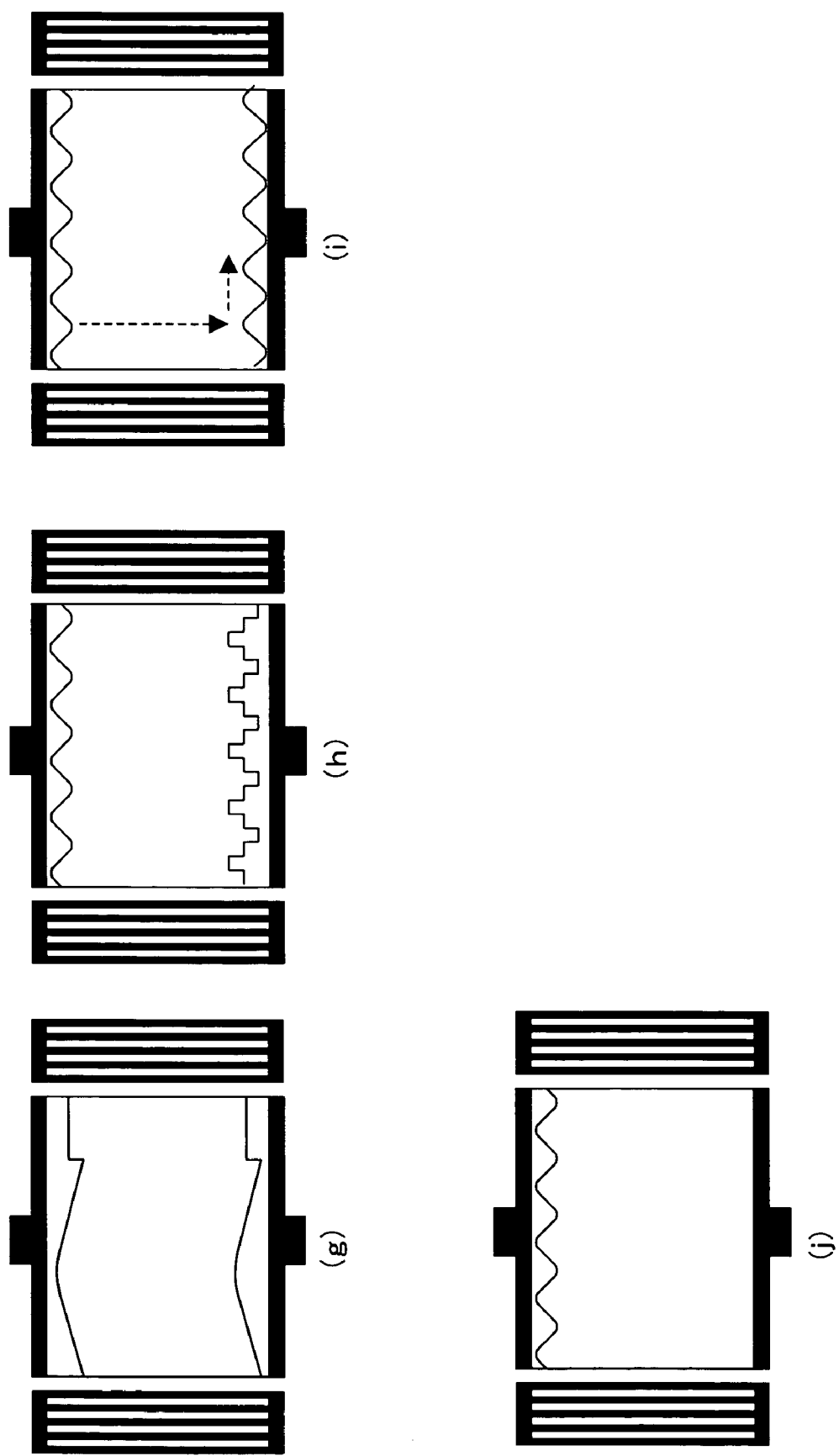

SURFACE ACOUSTIC WAVE APPARATUS

CROSS-REFERENCE TO RELATED APPLICATIONS

This application is based upon and claims the benefit of priority from the prior Japanese Patent Application No. 2005-197364, filed on Jul. 6, 2005, the entire contents of which are incorporated herein by reference.

BACKGROUND OF THE INVENTION

1. Field of the Invention

The present invention relates generally to a surface acoustic wave (SAW) apparatus. More particularly, the present invention relates to a surface acoustic wave filter (SAW resonator filter) configured as a resonator filter using a surface acoustic wave resonator (SAW resonator) or resonator having resonant characteristics in VHF and UHF bands.

2. Description of the Related Art

Recently, SAW devices are widely used in the telecommunications sector. Especially, SAW resonators or SAW resonator filters (hereinafter, referred to as SAW resonator devices) can be miniaturized and have lower loss and used a lot in mobile phones, remote keyless entry systems of automobiles and the like.

The SAW resonator device is constituted by at least one interdigital transducer (IDT) electrode disposed on a piezoelectric substrate and reflectors typically provided on both sides thereof. In the SAW resonator device, energy is confined between the reflectors by reflecting SAW propagated on the piezoelectric substrate through excitation of the IDT. On this occasion, a main propagation mode is a basic mode of modes distributing the energy vertically to the propagation direction of the SAW (hereinafter, referred to as transverse modes). On the other hand, second- or higher-order transverse modes also exist and, although electric charges excited by oscillations of even-order modes are canceled out, electric charges due to odd-order mode are not cancelled out and appear in resonator characteristics as spurious responses.

This spurious due to the higher-order transverse modes exerts a harmful influence as an oscillating-frequency skip phenomenon in an oscillation circuit in the case of the SAW resonator or an in-band ripple in the SAW resonator filter. The higher-order transverse modes are generated because an excitation intensity distribution of the SAW is in a rectangular shape.

FIG. 1 shows how the spurious is generated due to the higher-order transverse modes, using an example of a one-port SAW resonator with one (1) IDT 1 disposed between a pair of reflectors 2a, 2b. Although only a basic transverse mode 10a and a third-order transverse mode 10b are shown in the figure, fifth-, seventh- and higher-order transverse modes exist depending on an aperture length of the IDT.

In order to take a countermeasure for the spurious of the higher-order transverse modes, as shown in FIG. 2, it is known that the excitation intensity distribution 10 of the SAW is matched or approximated with the basic transverse mode 10a to constrain the higher-order transverse modes by using a COS function as overlapping-length weighting envelope curves to perform weighting for overlapping portions where a plurality of comb-shaped electrodes 1c connected to common electrodes 1a, 1b are interleaved (see., e.g., Japanese Examined Patent Application Publication No. 7-28195, Japanese Patent Application Laid-Open Publication Nos. 9-270667 and 7-22898).

In conventional examples, when the overlapping-length weighting envelope curves are looked along the direction of the surface acoustic wave, although the overlapping length is gradually increased, the overlapping length takes a downward turn at a certain changing point. This changing point exists as only one point.

The overlapping-length weighting envelope curves are mirror symmetry relative to an axis which is the propagation direction of the surface acoustic wave. Closely examining the symmetric property, for example, in a solid electrode configuration, a difference is generated which corresponds to a distance between adjacent electrode fingers, i.e., a ½ surface acoustic wavelength, however, not only in the solid electrode configuration, the ½ offset in the symmetric property of surface acoustic wavelength due to the electrode configuration is apparent from the structure of a surface acoustic wave apparatus, is not an essential portion of the present invention, and thus is not mentioned later while descriptions are made using the overlapping-length weighting envelope curves.

However, as shown in FIG. 2, if overlapping portions of comb-shape electrodes 1c is weighted by a COS function as an overlapping-length weighting envelope curves, a distribution 11 is changed which is along the propagation direction of the overlapping length of the comb-shape electrodes of an IDT 1 and therefore, an excitation intensity distribution 10 of the SAW is also changed in the propagation direction.

Especially, the SAW resonator filter is affected significantly because the filter characteristics are achieved using a mode with a distribution in the propagation direction (longitudinal mode).

In the case of an IDT electrodes with uniform overlapping length (normal(non-apodized) IDT electrodes), although a desired characteristic, for example, a bandwidth or an attenuation amount in a desired frequency can be achieved, spurious is generated due to the transverse mode. If the IDT electrodes are weighted by a COS function, although the spurious can be suppressed, a desired characteristic cannot be achieved very frequently.

SUMMARY OF THE INVENTION

It is therefore an object of the present invention to provide a surface acoustic wave apparatus which has a configuration for suppressing the spurious of the higher-order transverse modes and for not changing a SAW excitation intensity distribution in the propagation direction.

In order to achieve the above object, according to an aspect of the present invention there is provided a surface acoustic wave apparatus having at least one interdigital transducer, wherein the interdigital transducer is disposed such that a plurality of comb-shape electrodes respectively connected to common electrodes are interleaved, wherein a region with the plurality of interleaved comb-shape electrodes has a first overlapping region with an overlapping length constant over a whole area along a propagation direction of a surface acoustic wave and a second overlapping region formed on at least one side of the first overlapping region with an overlapping length weighted in the propagation direction of the surface acoustic wave, and wherein an overlapping-length weighting envelope curve in the second overlapping region has at least two changing points in the propagation direction of the surface acoustic wave. The second overlapping regions may be formed on both sides of the first overlapping region, and the overlapping-length weighting envelope curves in the second overlapping regions may have a shape which is moved vertically to the surface acoustic wave propagation direction in parallel on both sides of the first overlapping region. The second overlapping regions may be formed on both sides of the first overlapping region, and one of the overlapping-length weighting envelope curves in the second overlapping regions may have a shape of the other overlapping-length weighting envelope curve in the second overlapping regions moved vertically to the propagation direction as well as in the propagation direction in parallel. The second overlapping regions may be formed on both sides of the first overlapping region, and the overlapping-length weighting envelope curves in the second overlapping regions may have shapes which is mirror symmetry relative to an axis of the propagation direction of the surface acoustic wave on both sides of the first overlapping region. The second overlapping regions may be formed on both sides of the first overlapping region, and the overlapping-length weighting envelope curves in the second overlapping regions may have shapes different from each other on both sides of the first overlapping region.

In order to achieve the above object, according to another aspect of the present invention there is provided a surface acoustic wave apparatus with at least one interdigital transducer, wherein the interdigital transducer is disposed such that a plurality of comb-shape electrodes respectively connected to common electrodes are interleaved, wherein a region with the plurality of interleaved comb-shape electrodes has a first, overlapping region with an overlapping length constant over a whole area along a propagation direction of a surface acoustic wave and second overlapping regions formed on both sides of the first overlapping region with an overlapping length weighted in the propagation direction of the surface acoustic wave, and wherein overlapping-length weighting envelope curves in the second overlapping regions have only one changing point in the propagation direction of the surface acoustic wave and have a shape which is moved vertically to the surface acoustic wave propagation direction in parallel on both sides of the first overlapping region.

One of the overlapping-length weighting envelope curves in the second overlapping regions may have a shape of the other overlapping-length weighting envelope curve in the second overlapping regions moved vertically to the propagation direction as well as in the propagation direction in parallel. The overlapping-length weighting envelope curves in the second overlapping regions may form a shape represented by a periodic function f(x) when the propagation direction of the surface acoustic wave is a variable x. The size of the second overlapping regions is preferably set to 5% or more of the aperture length of the interdigital transducer. Regarding to the size of the weighted overlapping length in the second overlapping regions, a minimum weighted overlapping length is preferably set to 95% or less of the aperture length of the IDT. The common electrodes may have shapes corresponding to the overlapping-length weighting envelope curves in the second overlapping regions.

According to the present invention, transversal-mode spurious is suppressed and the same characteristics as normal (non-apodized) electrodes are achieved.

BRIEF DESCRIPTION OF THE DRAWINGS

The above and other objects, aspects, features and advantages of the present invention will become more apparent from the following detailed description when taken in conjunction with the accompanying drawings, in which:

FIG. 3 is a diagram showing an embodiment of the present invention;

FIG. 4A is a diagram showing an example that the bus bars 1a, 1b itself are set to have a solid pattern shape corresponding to weighting of the overlapping amounts of comb-shaped electrodes 1c in the overlapping regions B;

FIG. 4B is a diagram showing an example that the bus bars 1a, 1b do not have the dummy electrodes and are set to have gaps;

FIG. 8B is a diagram showing examples of various changed patterns (Part 2) of the weighting in the second overlapping region B as embodiments of the present invention;

FIG. 9B is an enlarged view of the inside of the band of FIG. 9A.

DESCRIPTION OF THE PREFERRED EMBODIMENT

An embodiment of the present invention will now be described with reference to the drawings. The embodiment is for the purpose of describing the present invention and the technical scope of the present invention is not limited to this.

FIG. 3 is a diagram showing a configuration of an embodiment of the present invention.

Figure 1:
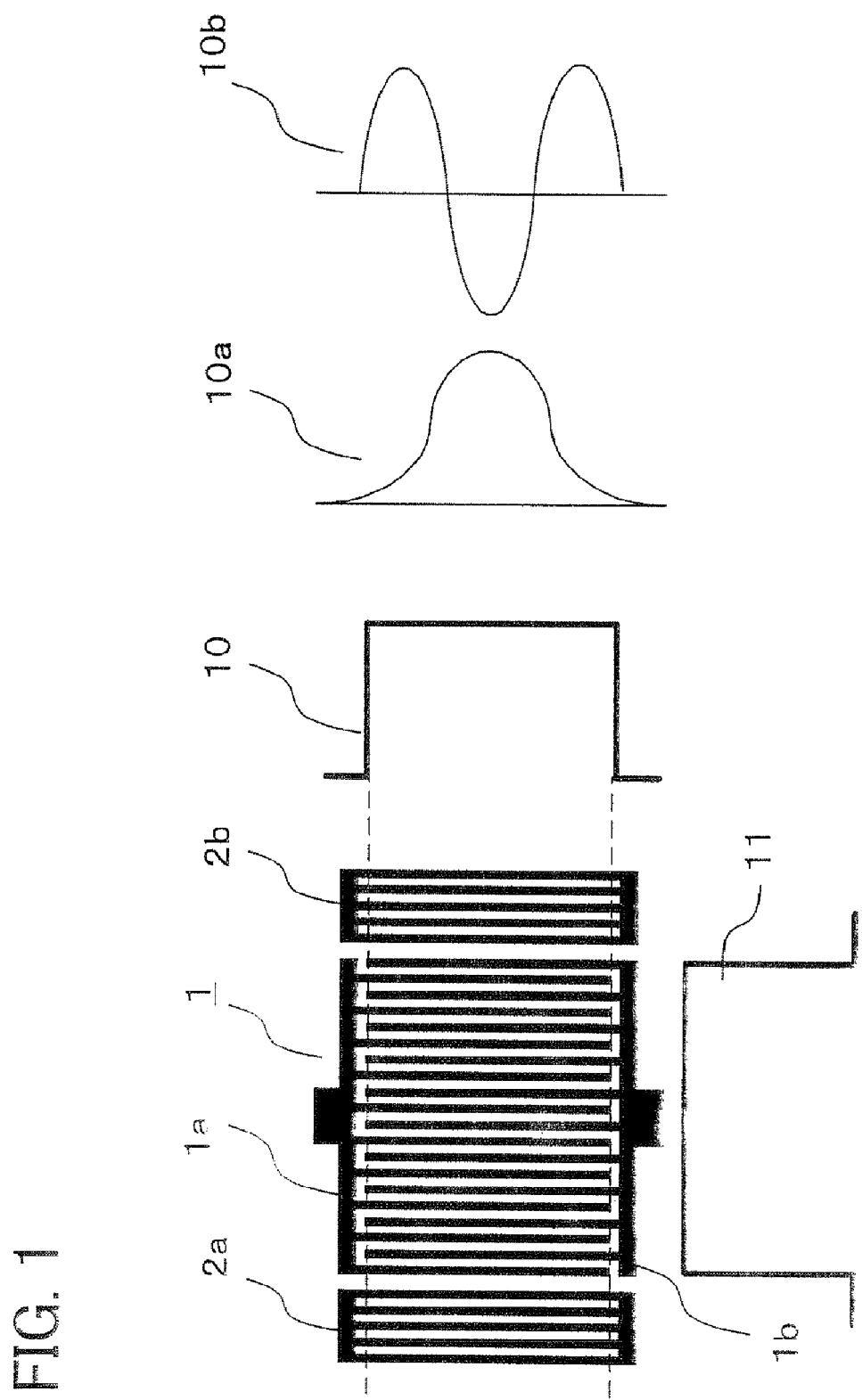
FIG. 1 is a diagram showing a one-port SAW resonator.
Figure 2:
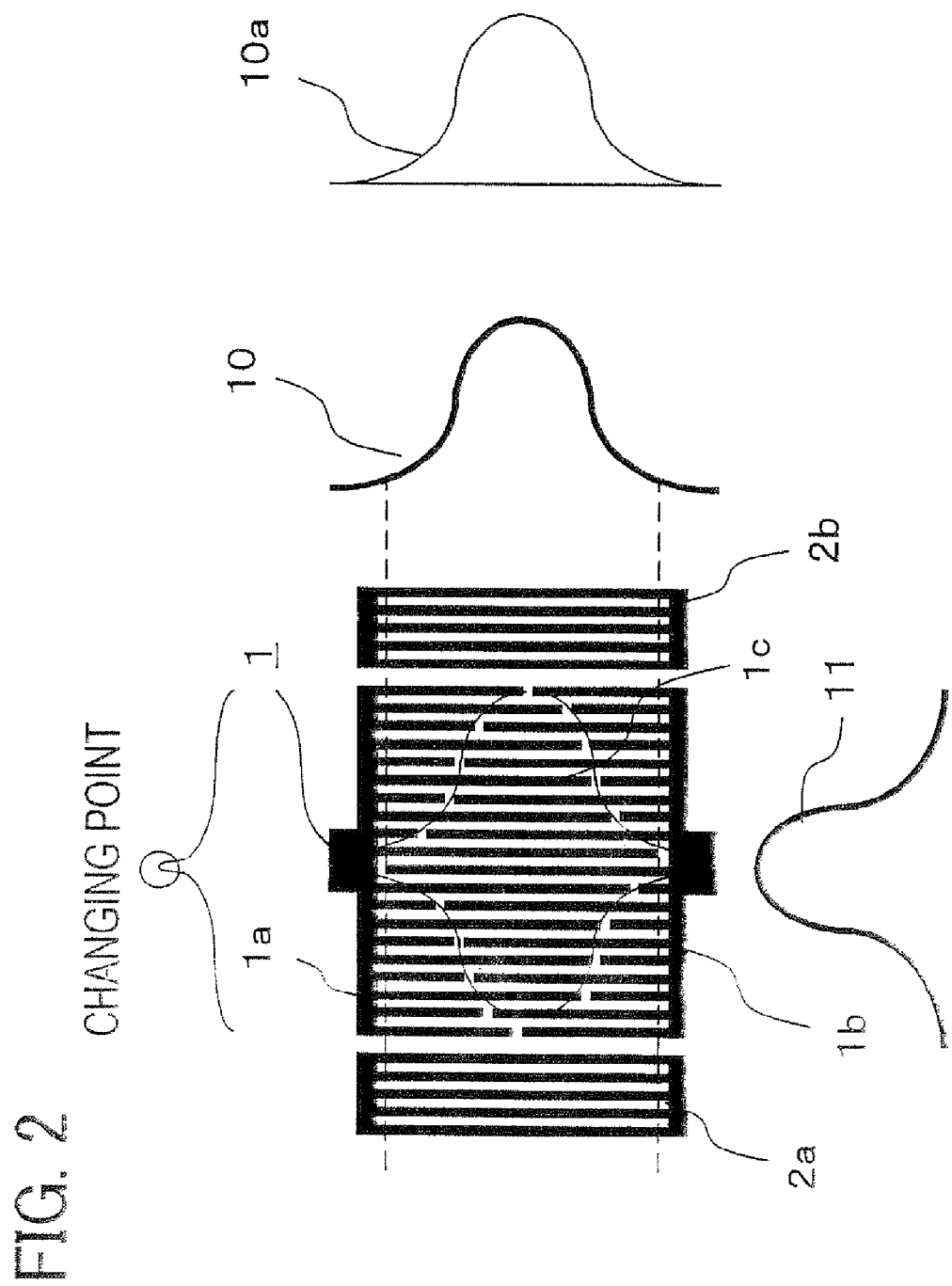
FIG. 2 is a diagram showing a conventional configuration for taking a countermeasure to spurious in higher-order transverse modes.

As shown above in FIG. 1 and FIG. 2, in a surface acoustic wave apparatus with a pair of reflection electrodes 2a, 2b and interdigital transducer 1 disposed between the reflection electrodes 2a, 2b, the reflection electrodes 2a, 2b and the interdigital transducer 1 is formed on a piezoelectric substrate not shown, such as $LiTaO_3$, $LiNbO_3$, $Li_2B_4O_7$ and quartz.

As a feature, the interdigital transducer 1 is configured by disposing a plurality of comb-shaped electrodes 1c respectively connected to common electrodes (bus bars) 1a, 1b to be interleaved. For a region where a plurality of comb-shaped electrodes 1c are interleaved, the region has a first overlapping region A where the overlapping length is constant over a whole area along the propagation direction of a surface acoustic wave (direction of an arrow of the figure) and a second overlapping regions B, formed on both sides of the first overlapping region A, where the overlapping length is weighted in the propagation direction of a surface acoustic wave.

With such a configuration, since the overlapping region A of the figure works the same way as the normal (non-apodized) IDT, the excitation intensity distribution of the surface acoustic wave is in a rectangular shape, which corresponds to the proximity of the center. In the overlapping regions B (hereinafter, referred to as weighted overlapping regions B), weighting is performed such that the excitation intensity is gradually reduced toward outside in the direction vertical to the SAW propagation of the IDT 1. Therefore, when combining the overlapping region A and the overlapping regions B, the excitation intensity distribution of the surface acoustic wave is in a shape approximate to a basic transverse mode 10a. In this way, only the basic transverse mode 10a is generated and higher-order transverse modes are suppressed.

On the other hand, an overlapping-length distribution 11 along the propagation direction of the surface acoustic wave is in a rectangular shape due to the first overlapping region A, and overlapping lengths 11a due to the second overlapping regions B form patterns overlapped with this. In other words, in the second overlapping regions B, weighting is performed with overlapping-length weighting envelope lines moved vertically to the surface acoustic wave propagation direction in parallel. In this way, although the overlapping lengths 11a are uneven between adjacent overlapping lengths, since the difference of the unevenness is generally small relative to the overlapping length of the overlapping region A, the distribution 11 is maintained in an almost rectangular shape along the propagation direction of the overlapping lengths.

As a result, the excitation intensity is maintained in a rectangular shape approximate to the normal (non-apodized) IDT in the propagation direction of the surface acoustic wave.

As described above, according to the present invention, the spurious due to the higher-order transverse modes is suppressed, and the same characteristics as the normal (non-apodized) electrodes can be achieved.

Although dummy electrodes are generally provided on the bus bars 1a, 1b, even if the dummy electrodes are not provided in the overlapping regions B as shown in an embodiment of FIGS. 4A and B, the effect can be similarly achieved for suppressing the higher-order transverse modes.

In FIG. 4A, the bus bars 1a, 1b do not have the dummy electrodes and the bus bars 1a, 1b itself are set to have a solid pattern shape corresponding to weighting of the overlapping amounts of the comb-shaped electrodes 1c in the overlapping regions B. FIG. 4B is an example that the bus bars 1a, 1b do not have the dummy electrodes and are set to have gaps.

Then, a discussion is made for a preferred value for a percentage of the size in the width direction of the first overlapping region A where the overlapping length is constant over a whole area along the propagation direction of a surface acoustic wave to that of the second overlapping regions B, formed on both sides of the first overlapping region A, where the overlapping lengths are weighted along the propagation direction of the surface acoustic wave, when the surface acoustic wave apparatus is used as a bandpass filter.

Figure 5:
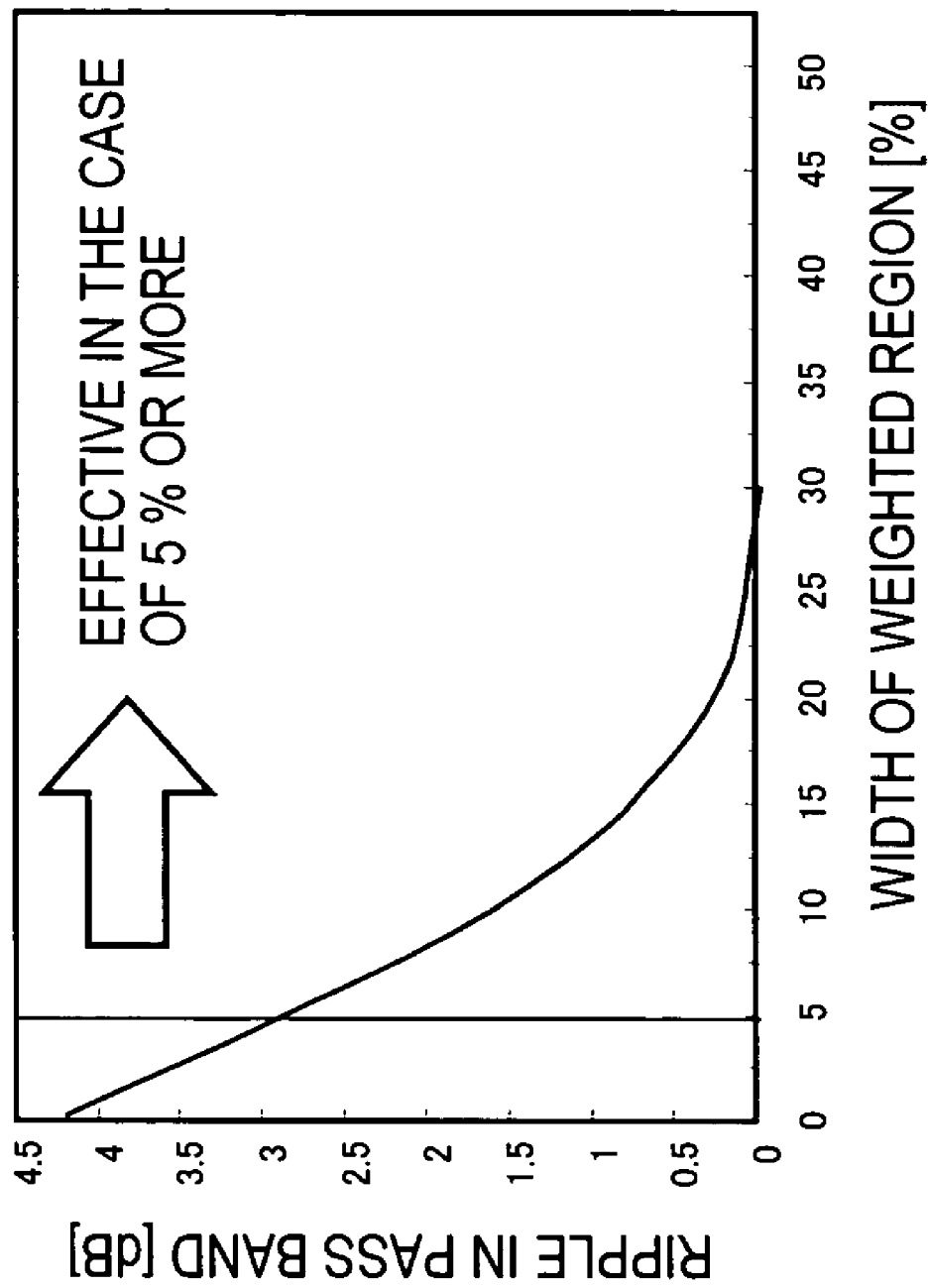
FIG. 5 is a graphical representation of a measured relationship between values obtained by a following equation as a percentage of the width of the second overlapping regions B which are the weighted region and a magnitude of ripple in a pass band when the surface acoustic wave apparatus is used as a bandpass filter.

FIG. 5 is a graph of a measured relationship between values obtained by a following equation as a percentage of the width of the second overlapping regions B which are the weighted region and a magnitude of ripple in a pass band when the surface acoustic wave apparatus is used as a bandpass filter.

width of weighted region=second overlapping regions B/(first overlapping region A+second overlapping regions B)×100

It is noted that (first overlapping region A+second overlapping regions B) corresponds an aperture length of the IDT.

If the percentage of the widths of the second overlapping regions B, i.e., the weighted region is 5% or more, the magnitude of ripple in a pass band can be suppressed to 3 db or less.

In this way, it is understood that the width of the weighted region (%) may be 5% or more of the aperture length of the IDT in order for the surface acoustic wave apparatus according to the present invention to obtain characteristics required for a bandpass filter.

Then, a discussion is made for changing patterns of the weighting in the second overlapping regions and characteristics when the surface acoustic wave apparatus is used as a bandpass filter.

Figure 6:
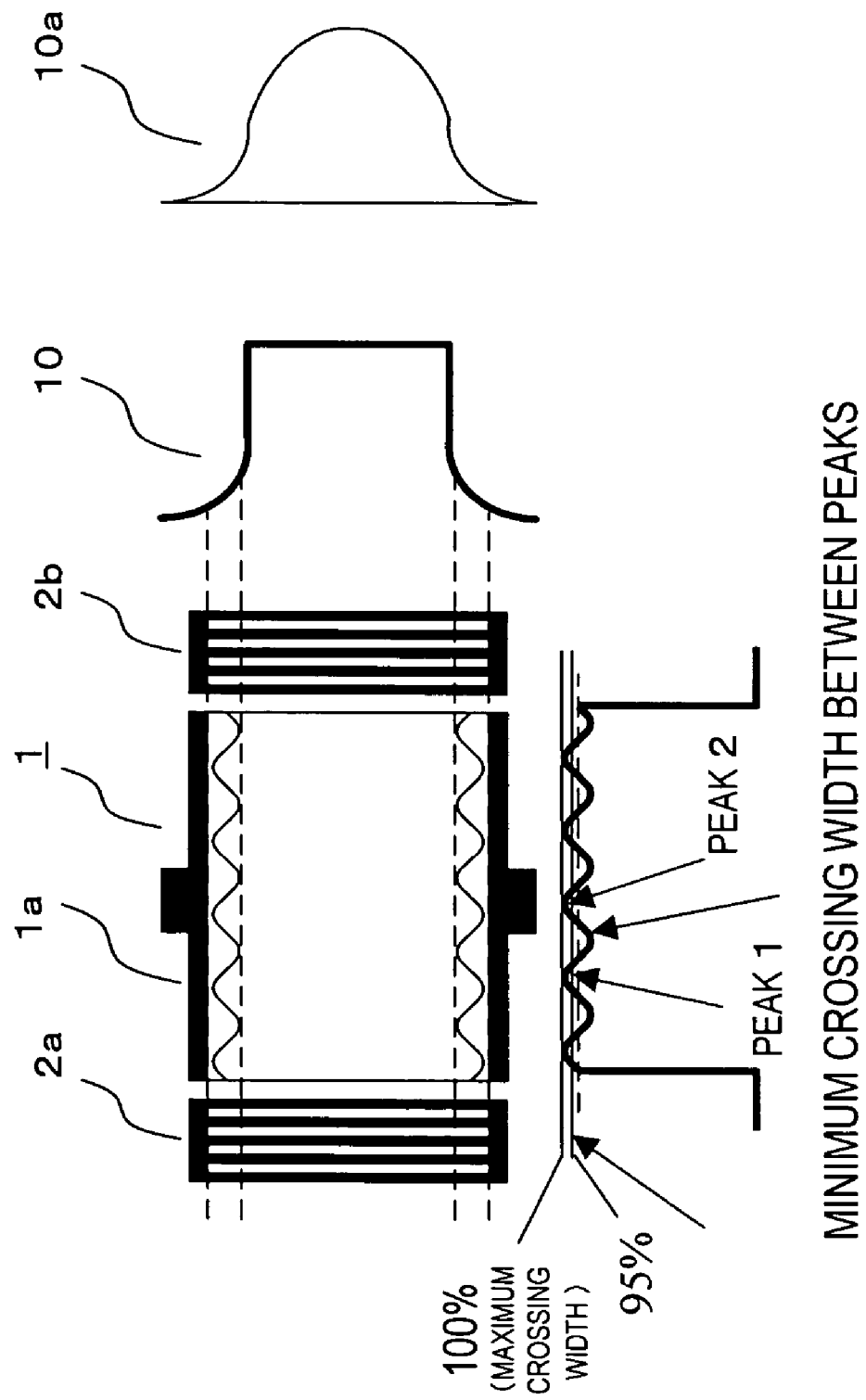
FIG. 6 is a diagram showing an example that minimum peaks and maximum peaks are generated by the weighting exists in the second overlapping regions B.

FIG. 6 shows an example that overlapping-length weighting envelope curves in the second overlapping regions B are mirror symmetry on the both sides of the first overlapping region relative to an axis which is the propagation direction of the surface acoustic wave and that minimum peaks and maximum peaks are generated by the weighting exists in the second overlapping regions B. A size of a minimum overlapping length between the minimum peak P1 and the maximum peak P2 can be represented by a percentage (%) to the IDT's aperture length of the minimum peak P1. The minimum overlapping length between respective peaks in the overlapping length distribution is valid when the minimum overlapping length is 95% or less of the maximum overlapping length. This is because the weighting has little effect on the constraint of the higher-order transverse modes if the minimum overlapping length is greater than 95%.

Figure 7:
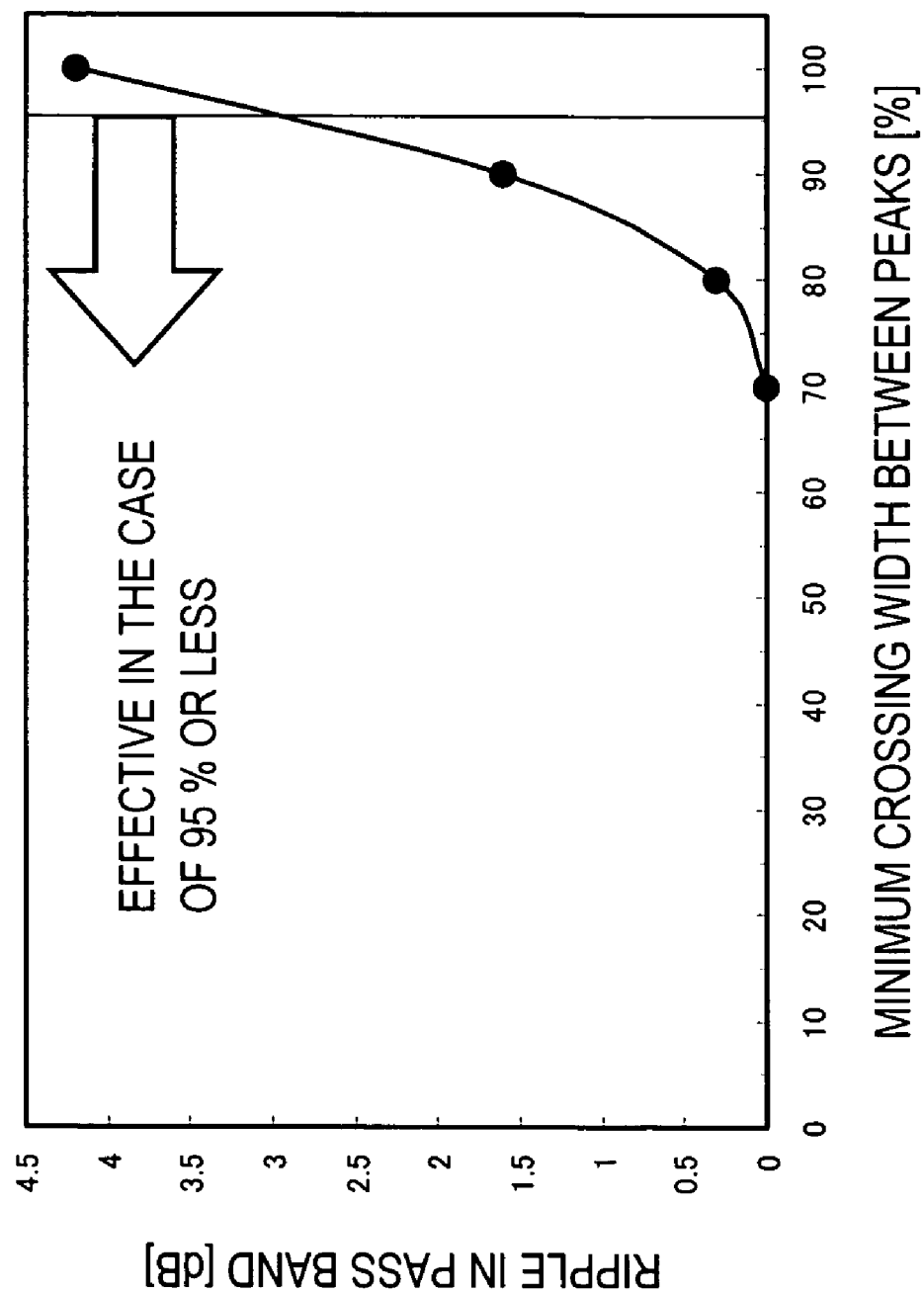
FIG. 7 shows a result of measurement of the ripple in the pass band of the filter when the minimum overlapping length between peaks is changed.

FIG. 7 is a result of measurement of the ripple in the pass band of the filter when the minimum overlapping length between peaks is changed. From this result, it is understood that if the minimum overlapping length between peaks is 95% or less, the suppressing effect is exerted on the higher-order transverse modes and the ripple in the pass band can be reduced exponentially.

In the above embodiment, as a changing pattern of the weighting in the second overlapping regions B, an example has been shown which has been changed along the SIN curve shown in FIG. 3. However, the application of the present invention is not limited to such an embodiment.

Figure 8A:
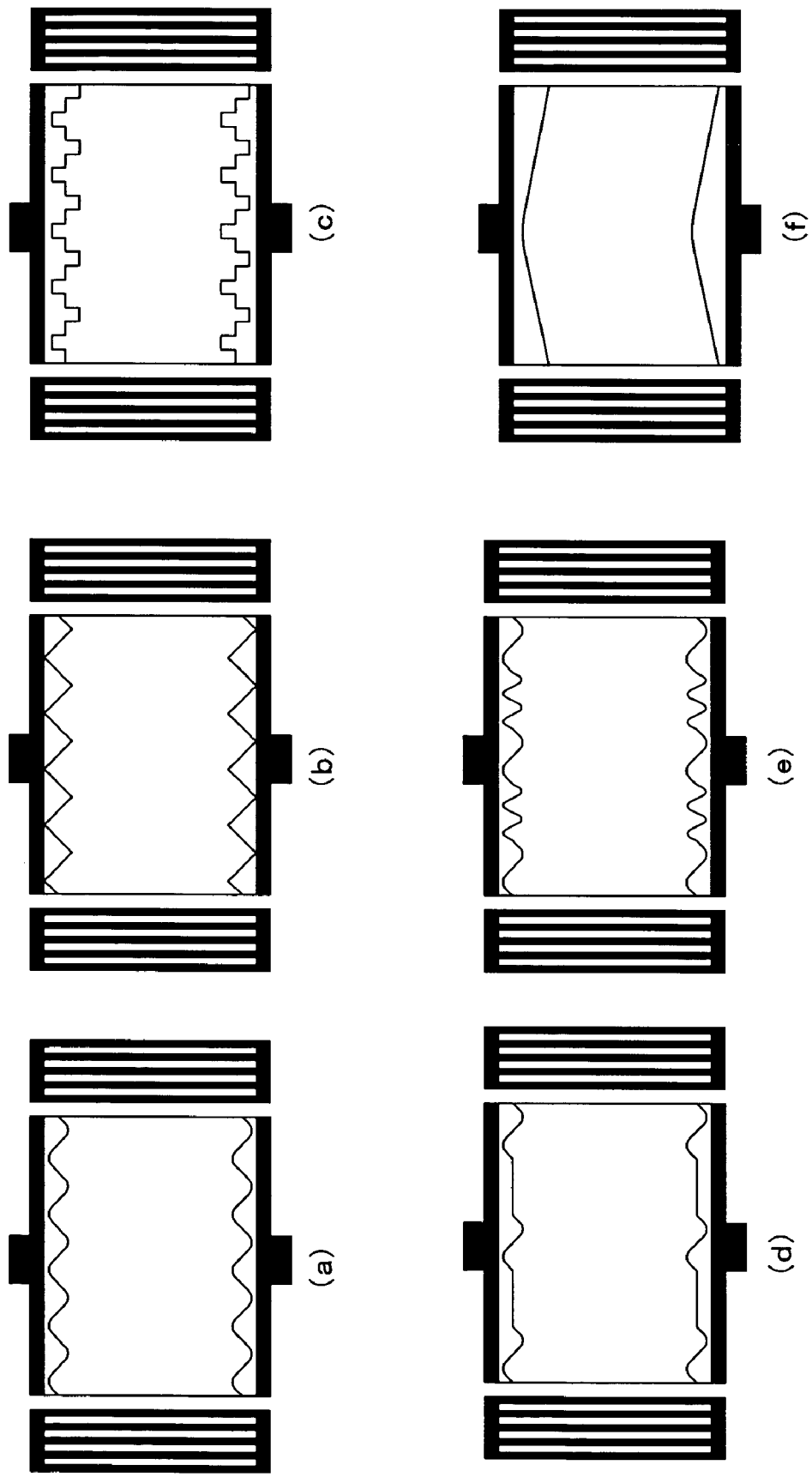
FIG. 8A is a diagram showing examples of various changed patterns (Part 1) of the weighting in the second overlapping region B as embodiments of the present invention.

In FIGS. 8A and B, as embodiments of the present invention (Part 1, Part 2), various examples of the weighting in the second overlapping regions are shown as envelope curve patterns thereof.

In FIG. 8A, overlapping-length weighting envelope curves of (a) is a COS (or SIN) periodic function f(x) and the same as the embodiment shown in FIG. 3.

(b) is a periodic function of triangular wave. (c) is a periodic function alternating 1 and 0 values. (d) is an example of performing the weighting to a portion of the IDT, rather than the entire area thereof. (e) is an example of a combination of different functions. (f) is an example of one (1) cycle rather than a plurality of cycles and, in this example, although only one (1) changing point exists, since the overlapping-length weighting envelope curves is not mirror symmetry relative to an axis which is the propagation direction of the surface acoustic wave, the distribution of the overlapping length forms an almost rectangular shape along the propagation direction.

In FIG. 8B, (g) is a pattern example having the (f) pattern and a region where the weighting does not exist as a portion thereof. (h) is an example of the overlapping-length weighting envelope curves which are different from each other in the second overlapping regions B.

(i) is an example that one of the overlapping-length weighting envelope curves is the other overlapping-length weighting envelope curve arbitrarily moved vertically to the propagation direction as well as in the propagation direction inparallel. In either case of (h) or (i), since the distribution of the overlapping length forms an almost rectangular shape, the same effect can be obtained.

(j) is an example forming the second overlapping region only on the one side of the first overlapping region. Although the effect is reduced as compared to the case of forming the second overlapping regions on both sides of the first overlapping region, a better effect can be achieved as compared to the conventional normal (non-apodized) configuration shown in FIG. 2.

In any case of such weighting, the requirement of the present invention exists and the effect of the present invention can be obtained.

Figure 9B:
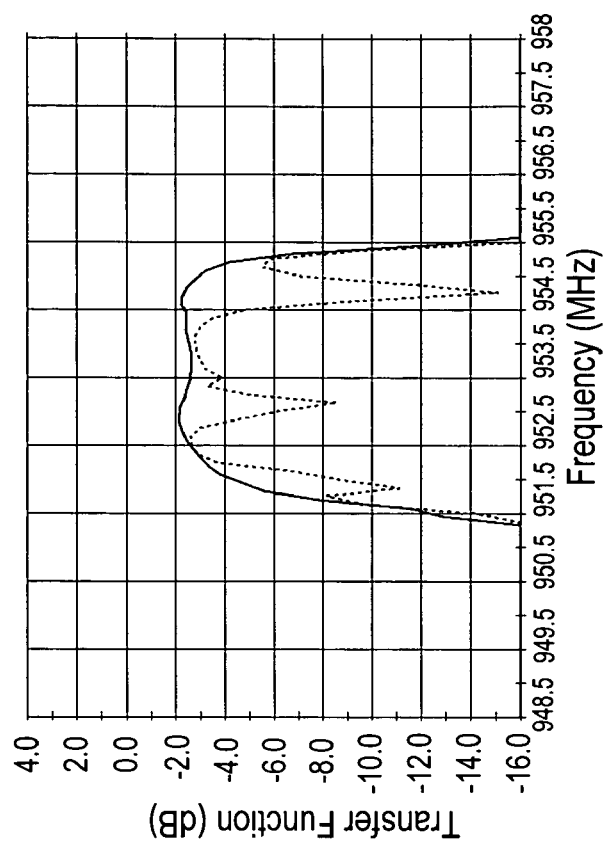
FIGS. 9A and 9B are diagrams showing characteristics of a device manufactured experimentally on a $Li_2B_4O_7$ substrate with a 31DT resonator filter and a one-port resonator in cascade connection.
Figure 9A:
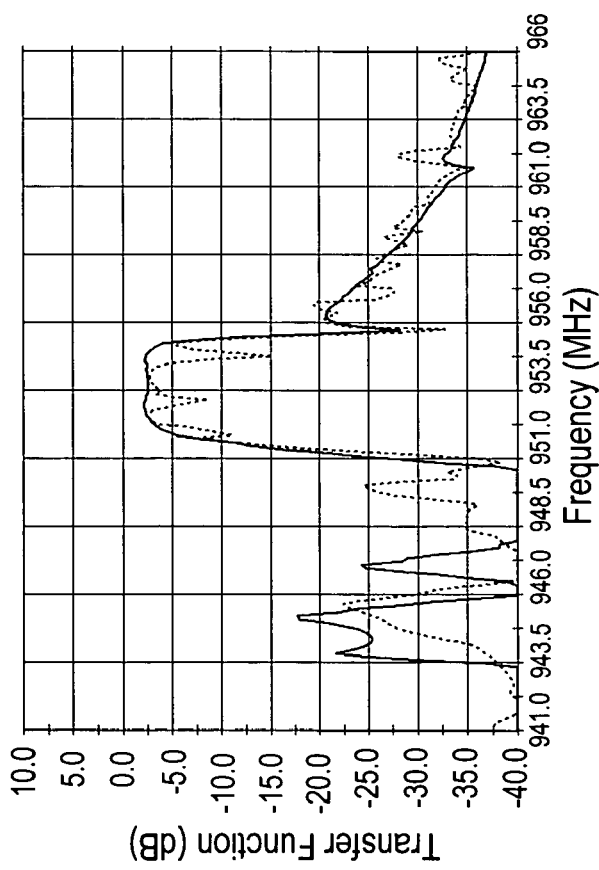

FIG. 9A shows characteristics of a device manufactured experimentally on a $Li_2B_4O_7$ substrate with a 31DT resonator filter and a one-port resonator in cascade connection. FIG. 9B is an enlarged view of the inside of the band of FIG. 9A In the figures, a dashed line is an actually measured characteristic of the normal (non-apodized) IDT and a solid line is a characteristic in the case when the present invention is applied.

A COS function is used for the weighting and, since the number of IDT pairs are 100 or more which are sufficiently large for the 31DT resonator filter and the one-port resonator, the weighting as shown in FIG. 6 is in mirror symmetry for the upper and lower side of the IDT. The spurious can be suppressed and the bandwidth and out-of-band damping characteristic can be achieved as is the case with the normal (non-apodized) IDT.

As set forth hereinabove, according to the present invention, transverse-mode spurious can be suppressed and the same characteristics can be achieved as normal (non-apodized) electrodes. In this way, a SAW resonator and SAW resonator filter can be designed with high degree of freedom and excellent characteristics.

While the illustrative and presently preferred embodiment of the present invention has been described in detail herein, it is to be understood that the inventive concepts may be otherwise variously embodied and employed and that the appended claims are intended to be construed to include such variations except insofar as limited by the prior art.

What is claimed is:

1. A surface acoustic wave apparatus having at least one interdigital transducer, which is disposed such that a plurality of comb-shape electrodes respectively connected to bus bars are interleaved,
    wherein a region with the plurality of interleaved comb-shape electrodes includes a first overlapping region with an overlapping length constant over a whole area along a propagation direction of a surface acoustic wave, and two second overlapping regions respectively formed on both sides of the first overlapping region with an overlapping length weighted in the propagation direction of the surface acoustic wave,
    wherein an envelope curve of the overlapping-length weighted in each of the second overlapping regions has at least two changing points in the propagation direction of the surface acoustic wave; and wherein
    dummy electrodes are provided except at positions corresponding to the changing points, one end of the dummy electrodes being connected to the bus bars while another end of the dummy electrodes facing corresponding ends of the plurality of comb-shaped electrodes.

2. The surface acoustic wave apparatus according to claim 1,
    wherein the overlapping-length weighting envelope curves in the second overlapping regions have a shape which is moved vertically to the surface acoustic wave propagation direction in parallel on both sides of the first overlapping region.

3. The surface acoustic wave apparatus according to claim 1,
    wherein one of the overlapping-length weighting envelope curves in the second overlapping regions has a shape of the other overlapping-length weighting envelope curve in the second overlapping regions moved vertically to the propagation direction as well as in the propagation direction in parallel.

4. The surface acoustic wave apparatus according to claim 1,
    wherein the overlapping-length weighting envelope curves in the second overlapping regions have shapes which is mirror symmetry relative to an axis of the propagation direction of the surface acoustic wave on both sides of the first overlapping region.

5. The surface acoustic wave apparatus according to claim 1,
    wherein the overlapping-length weighting envelope curves in the second overlapping regions have shapes different from each other on both sides of the first overlapping region.

6. The surface acoustic wave apparatus according to claim 1,
    wherein the overlapping-length weighting envelope curves in the second overlapping regions form a shape represented by a periodic function f(x) when the propagation direction of the surface acoustic wave is a variable x.

7. The surface acoustic wave apparatus according to claim 1,
    wherein a size of the second overlapping regions is set to 5% or more of the aperture length of the transducer.

8. The surface acoustic wave apparatus according to claim 1,
    wherein, regarding to a size of the weighted overlapping length in the second overlapping regions, a minimum weighted overlapping length is set to 95% or less of the aperture length of the interdigital transducer.

9. The surface acoustic wave apparatus according to claim 1,
    wherein the bus bars have shapes corresponding to the overlapping-length weighting envelope curves in the second overlapping regions.

10. A surface acoustic wave apparatus with at least one interdigital transducer, which is disposed such that a plurality of comb-shape electrodes respectively connected to bus bars are interleaved,
    wherein a region with the plurality of interleaved comb-shape electrodes has a first overlapping region with an overlapping length constant over a whole area along a propagation direction of a surface acoustic wave and second overlapping regions formed on both sides of the first overlapping region with an overlapping length weighted in the propagation direction of the surface acoustic wave, and
    wherein overlapping-length weighting envelope curves in the second overlapping regions have only one changing point in the propagation direction of the surface acoustic wave and have a shape which is moved vertically to the surface acoustic wave propagation direction in parallel on both sides of the first overlapping region.

11. The surface acoustic wave apparatus according to claim 10,
    wherein one of the overlapping-length weighting envelope curves in the second overlapping regions has a shape of the other overlapping-length weighting envelope curve in the second overlapping regions moved vertically to the propagation direction as well as in the propagation direction in parallel.

12. The surface acoustic wave apparatus according to claim 10, wherein the overlapping-length weighting envelope curves in the second overlapping regions form a shape represented by a periodic function f(x) when the propagation direction of the surface acoustic wave is a variable x.

13. The surface acoustic wave apparatus according to claim 10, wherein a size of the second overlapping regions is set to 5% or more of the aperture length of the interdigital transducer.

14. The surface acoustic wave apparatus according to claim 10, wherein, regarding to a size of the weighted overlapping length in the second overlapping regions, a minimum weighted overlapping length is set to 95% or less of the aperture length of the interdigital transducer.

15. The surface acoustic wave apparatus according to claim 10, wherein the bus bars have shapes corresponding to the overlapping-length weighting envelope curves in the second overlapping regions.

* * * * *